United States Patent
Arya et al.

(10) Patent No.: US 7,724,568 B2
(45) Date of Patent: May 25, 2010

(54) MEMORY DEVICE HAVING READ CACHE

(75) Inventors: Siamak Arya, Cupertino, CA (US); Fong-Long Lin, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 128 days.

(21) Appl. No.: 12/040,707

(22) Filed: Feb. 29, 2008

(65) Prior Publication Data

US 2009/0219760 A1 Sep. 3, 2009

(51) Int. Cl.
*G11C 16/04* (2006.01)

(52) U.S. Cl. .............. 365/185.02; 365/185.08; 365/189.2

(58) Field of Classification Search ............ 365/185.02, 365/185.08, 189.2
See application file for complete search history.

(56) References Cited

U.S. PATENT DOCUMENTS

| | | | |
|---|---|---|---|
| 6,999,344 B2* | 2/2006 | Hosono et al. ......... | 365/185.17 |
| 7,287,115 B2* | 10/2007 | Otani et al. ..................... | 711/5 |
| 2002/0118593 A1* | 8/2002 | Takemae ..................... | 365/233 |
| 2003/0156473 A1* | 8/2003 | Sinclair et al. .............. | 365/200 |
| 2007/0147115 A1* | 6/2007 | Lin et al. ............... | 365/185.08 |

* cited by examiner

*Primary Examiner*—Pho M. Luu
(74) *Attorney, Agent, or Firm*—DLA Piper LLP (US)

(57) ABSTRACT

A memory device comprises a non-volatile electrically alterable memory which is susceptible to read disturbance. The device has a control circuit for controlling the operation of the non-volatile memory. The device further has a first volatile cache memory. The first volatile cache memory is connected to the control circuit and is for storing data to be written to or read from the non-volatile memory, as cache for the memory device. The device further has a second volatile cache memory. The second volatile cache memory is connected to the control circuit and is for storing data read from the non-volatile memory as read cache for the memory device. Finally the control circuit reads data from the second volatile cache memory in the event of a data miss from the first volatile cache memory, and reads data from the non-volatile memory in the event of a data miss from the first and second volatile cache memories.

14 Claims, 3 Drawing Sheets

Figure 1 – Prior Art

MEMORY DEVICE HAVING READ CACHE

TECHNICAL FIELD

The present invention relates to a memory device having a non-volatile memory for storage of data therein, wherein the non-volatile memory is subject to read disturbance, and a first volatile memory acting as a read/write cache for the non-volatile memory, and a second volatile memory acting as a data read cache in the event of a data miss from the first volatile memory.

BACKGROUND OF THE INVENTION

A memory device containing a non-volatile memory such as a NAND memory, is well known in the art. Referring to FIG. 1 there is shown a block level diagram of a memory device 10 of the prior art having a non-volatile memory 12 such as a NAND memory 12. A NAND controller 14 controls the operation of the NAND memory 12 to store data therein or to read data therefrom. The memory device 10 also comprises a PNOR cache 16, which is a volatile memory 16, such as PSRAM or DRAM. The cache 16 serves to store data to be written into the NAND memory 12 or to hold the data read from the NAND memory 12. The use of a memory cache 16 is advantageous for several reasons. First if NAND memory 12 is used, because the NAND memory stores a page of data at a time, if less than a page of data is desired to be stored or read, then the cache memory 16 can store the entire page of data read from (or to be written to) the NAND memory 12 from which the particular data within that page is then read from the memory device 10 or the entire page of data is written to the NAND memory 12. Second, the use of a volatile memory 16 as a cache is advantageous because typically a cache memory 16 operates faster than the non-volatile memory 12. The use of a NAND memory 12, with a NAND controller 14 and a volatile memory cache 16 functioning as a Pseudo NOR memory device is fully disclosed in U.S. 2007/0147115 A1 published Jun. 28, 2007, whose disclosure is incorporated herein by reference in its entirety.

Typically, the cache memory 16 is only a small amount of volatile memory and does not contain enough storage to store all the contents or data from the NAND memory 12. Thus, one of the functions of the NAND controller 14 is to ensure that the cache memory 16 is used most efficiently, in that the cache memory 16 should contain data that is most frequently requested thereby minimizing the number of times the NAND controller 14 must retrieve the requested data directly from the NAND memory 12. However, if multitude frequently accessed pages of NAND memory map to the same cache line, then reading one page may remove the needed page from the cache, over and over. Thus, "cache trashing" results. "Cache trashing" is the result of data in the cache memory 16 being continually changed, requiring the NAND memory 12 to be directly addressed and data read therefrom. Thus, there are occasions when read requests to the memory device 10 will result in a miss, in that the data is not found in the cache memory 16 but must be read directly from the NAND memory 12. In such event, the response of the memory device 10 is slowed. Further complicating the problem is that as multiple read requests to the same address in the NAND memory 12 occurs, excessive reading of the same location in the NAND memory 12 results. Excessive reading of the same location in a NAND memory 12 can result in read disturbance over time, and can cause read error. Thus, there is a need to minimize such read disturbance thereby reducing read errors.

In the prior art it is known that cache trashing, i.e. same data in a cache being frequently replaced, is a problem. However, cache trashing is a phenomenon known in processor caches. Further, it is well known to provide a small cache ("critical cache") to hold frequently missed cache lines to improve performance in a high speed processor. However, such critical cache is used to improve speed and to reduce access to slower main memories in read and write operations.

SUMMARY OF THE INVENTION

A memory device comprises a non-volatile electrically alterable memory which is susceptible to read disturbance. The device has a control circuit for controlling the operation of the non-volatile memory. The device further has a first volatile cache memory. The first volatile cache memory is connected to the control circuit and is for storing data to be written to or read from the non-volatile memory, as cache for the memory device. The device further has a second volatile cache memory. The second volatile cache memory is connected to the control circuit and is for storing data read from the non-volatile memory as read cache for the memory device. Finally the control circuit reads data from the second volatile cache memory in the event of a data miss from the first volatile cache memory, and reads data from the non-volatile memory in the event of a data miss from the first and second volatile cache memories.

DETAILED DESCRIPTION OF THE INVENTION

Figure 1:
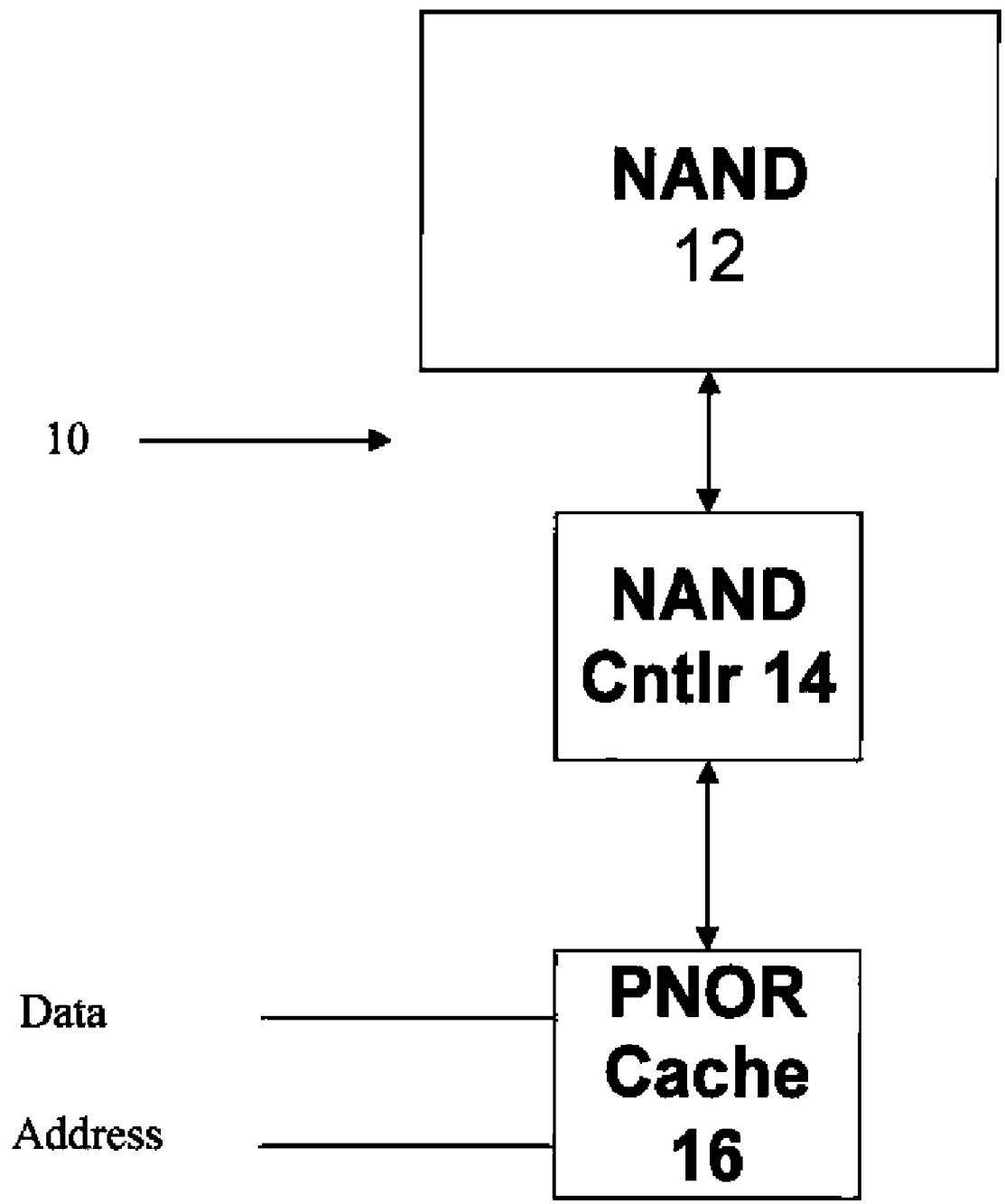
FIG. 1 is a block level diagram of a memory device of the prior art.
Figure 2:
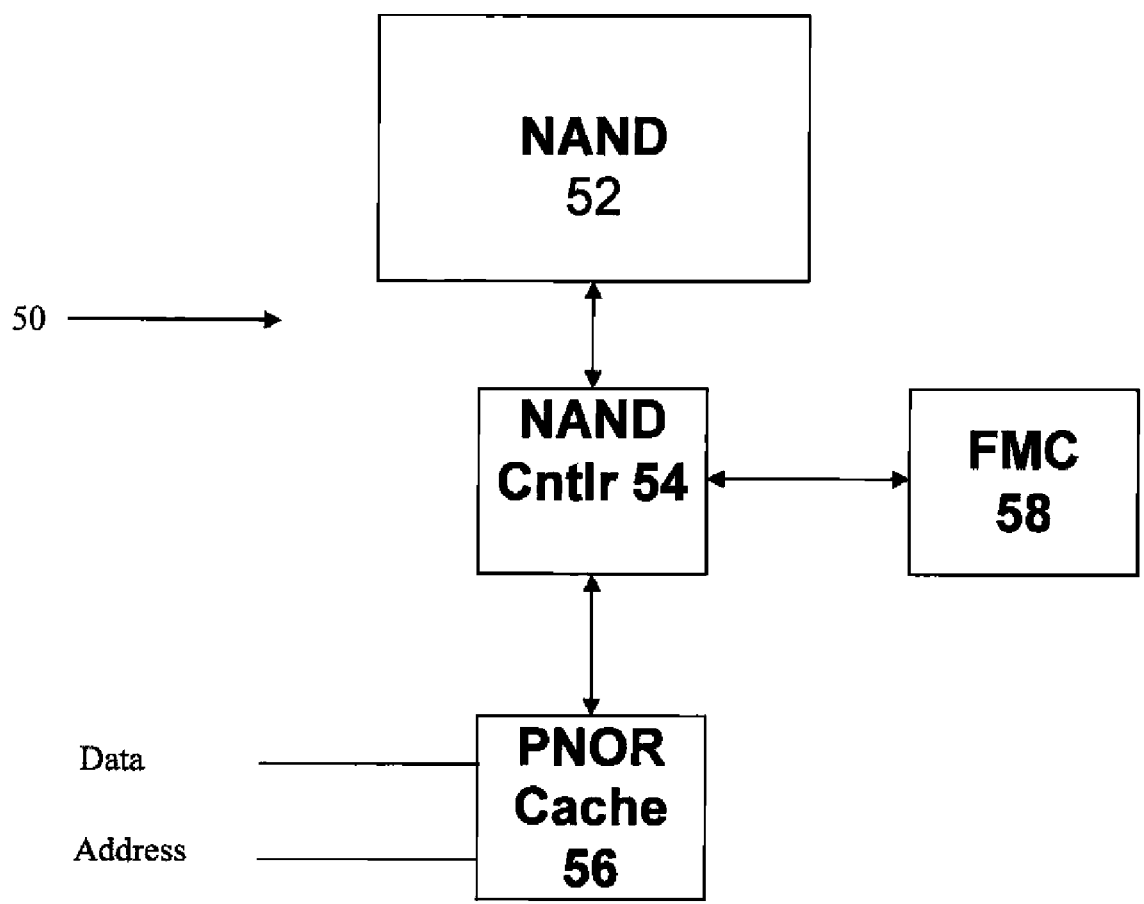
FIG. 2 is a block level diagram of one embodiment of a memory device of the present invention.

Referring to FIG. 2 there is shown a schematic block level diagram of a first embodiment of a memory device 50 of the present invention. The device 50 comprises a NAND memory 52, or any other type of memory which is susceptible to read disturbance. These include, but are not limited to, all floating gate type non-volatile memory, SONOS based non-volatile memory, MONOS based non-volatile memory or phase change based non-volatile memory. Thus, although the NAND memory 52 is a page read type of memory, it should be noted that the present invention is not limited to a page read type memory. The memory device 50 further comprises a NAND controller 54 and is connected to the NAND memory 52 for controlling the NAND non-volatile memory 52, as well as the other volatile memories to be discussed hereinafter. Clearly, if the non-volatile memory 52 were other than NAND type, then the controller 54 would also be a controller for that type of non-volatile memory 52. The device 50 also comprises a first volatile memory 56. The first volatile memory 56 is connected to the memory controller 54. The first volatile memory 56 serves to store as cache for the read and write operations for the memory device 50. Thus, the first volatile memory 56 serves as cache to store data intended to be written into the non-volatile memory 52, as well as to serve as cache for data read from the non-volatile memory 52. The device 50 also comprises a second volatile memory 58. The second volatile memory 58 is also connected directly to the memory controller 54. Each of the first and second volatile memories 56 and 58 can be SRAM or DRAM or any other type of RAM.

As disclosed in U.S. 2007/0147115 A1 published Jun. 28, 2007, whose disclosure is incorporated herein by reference in its entirety, the combination of a NAND memory 52, a NAND controller 54, and a first volatile memory 56 can function as a Pseudo NOR memory. Accordingly when a read request is received by the memory device 50, it is in the nature of a read from a particular address. However, because the NAND memory 52 stores data a page at a time, an entire page of data must first be read from the NAND memory 52 and stored in the first volatile memory cache 56, from which the particular data (usually one byte) at the specified address within the page is then read from the memory device 50. This can be done by a cache control mechanism that uses cache tags to keep track of the address of data in the cache memory 56 and comparing the address of the requested data with the tags to determine whether the data is in the cache memory or not—a hit or a miss.

In the event the data for the read address is not stored in the first volatile memory 56, then the controller 54 checks the second volatile memory 58 to determine if the data is stored therein. If the data for the read address is stored in the second volatile memory 58 then the controller 54 reads an entire page of data (containing the data for the read address) from the second volatile memory 58 and stores that entire page of data in the first volatile memory 56, and then supplies the data from the read address from the first volatile memory 56, as the read output of the memory device 50.

Finally, in the event, the data for the read address is not stored in the first volatile memory 56 or the second volatile memory 58, then the controller 54 reads an entire page of data (containing the data for the read address) from the NAND memory 52 and stores that entire page of data in the first volatile memory 56, and then supplies the data from the read address from the first volatile memory 56, as the read output of the memory device 50.

It should be noted that the second volatile memory 58 is dedicated to store only read cache data. Thus, the second volatile memory 58 only stores data read from the non-volatile NAND memory 52. One example of the particular manner by which the first and second volatile memories 56 and 58 are controlled is as follows, where the second volatile memory 58 is a fully set associative cache.

Initially, after power up, the contents of the first volatile memory 56 is blank. As each read request is received by the memory device 50, a page of data is read from the NAND memory 52 and is stored in the first volatile memory 56 and the second volatile memory 58. If a subsequent read request is received for data from an address that is within the page of data already stored in the first volatile memory 56, the data from the first volatile memory 56 is supplied as the read output of the memory device 50. Eventually, however, the first volatile memory 56 will be filled up, either due to the first volatile memory 56 storing multiple pages of data read from the NAND memory 52 and/or the first volatile memory 56 storing data to be written into the NAND memory 52.

As another read address request is received by the memory device 50, requiring the reading of another page of data from the NAND memory 52, that page of data can be stored in the first volatile memory 56, and causing cache trashing, i.e. replacing another page of data, with the replaced page of data. Further, if a new read address request is received by the memory device 50, the controller 54 first checks the first volatile memory 56 to attempt to determine if the read address request is within the range of pages of data stored in the first volatile memory 56. If not, then the controller 54 checks the second volatile memory 58 to determine if the read address request is within the range of data is stored in the second volatile memory 58. Clearly, it is desired to have the second volatile memory 58 have the capacity to store more than one page of data to avoid the cache trashing problem. In fact in the preferred embodiment, the second volatile memory 58 should store a multiple number of pages of storage available in the first volatile memory 56. Eventually, however, both first and second volatile memories 56/58 will be filled and a method must be devised to store the pages of data from the non-volatile memory 52 efficiently within the volatile memories 56/58. Although two methods are described herein, it should be noted that many other methods are possible, and the present invention is not limited to the methods described herein.

The first method is to store pages of data within the second volatile memory 58 based upon the least-recently-used replacement policy. In other words, assume now that both first and second volatile memories 56/58 are full. A read address request is received by the memory device 50 which causes the controller 54 to read another page of data from the non-volatile memory 52. The page of data read from the non-volatile memory 52 replaces a page of data that was least-recently used in the second volatile memory 58, as well as replacing a page of memory in the first volatile memory 56. Thus, in this method the least recently used page of data, in terms of temporal time, is replaced. Therefore, within the controller 54 is a table which correlates each page of data stored in the second volatile memory 58 with a time stamp showing when that page was last accessed. The page of memory in the second volatile memory 58 that is the oldest in time, is then a candidate to be replaced in the event of cache trashing of the second volatile memory 58.

Another way is to store pages with the controller 54 keeping track of the number of times or frequency with which a page of data is accessed. The page of data in the second volatile memory 58 having the lowest frequency of access, irrespective of when the last access occurred, is then replaced. Thus, within the controller 54 is a table which correlates each page of data stored in the second volatile memory 58 with a frequency of access stamp showing how frequently the page was accessed. Alternatively, the controller 54 may use an algorithm based upon fixed periods of time.

Finally, when a page of data is stored in the first volatile memory 56 to be written into the NAND memory 52, and that page of data replaces an existing page of data which is already cached and is stored either in the first volatile memory 56 or the second volatile memory 58, then the page of data that is a read from the cache in either of the first or second volatile memories 56/58 is no longer valid and may be deleted or replaced.

Figure 3:
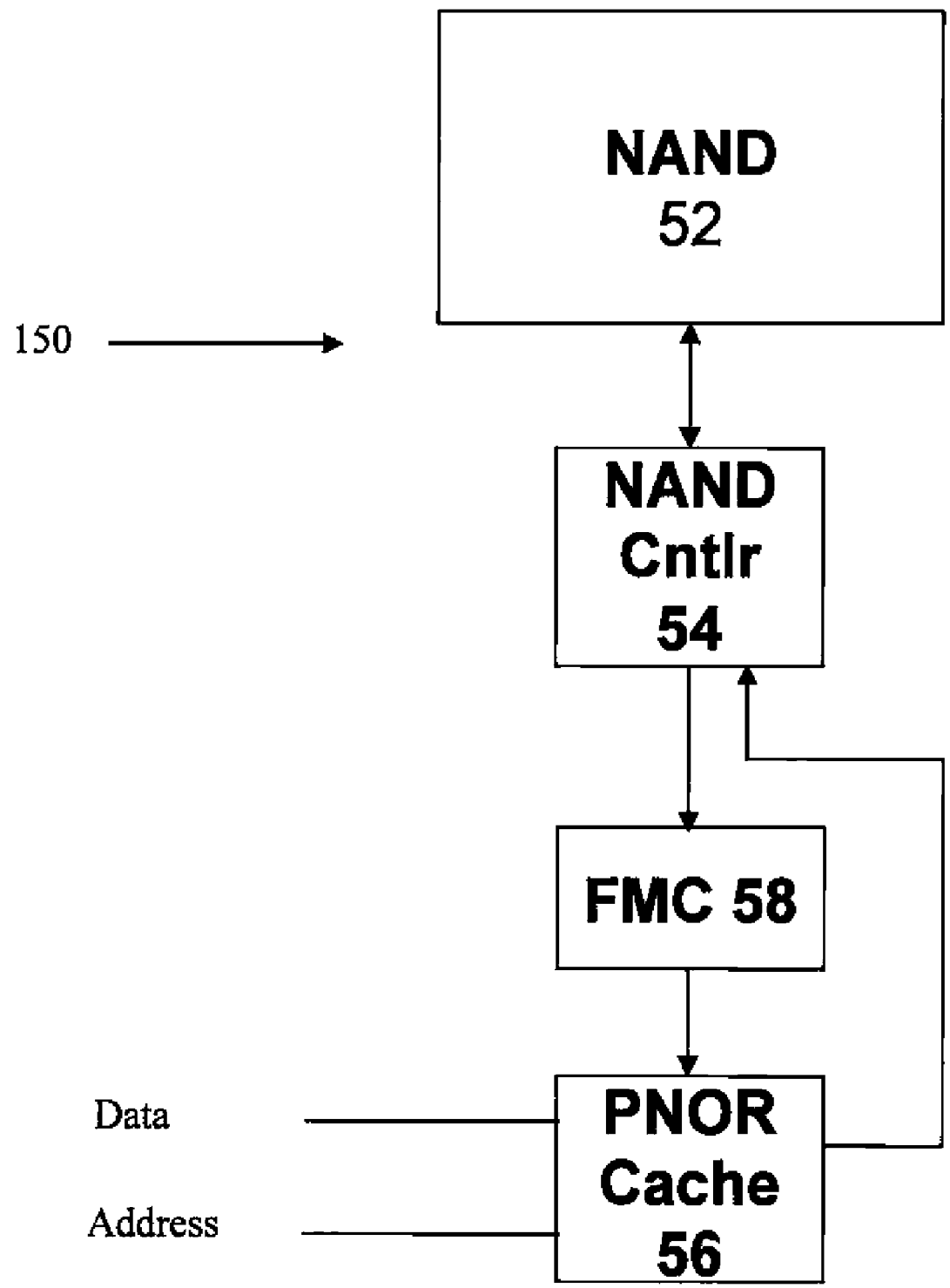
FIG. 3 is a block level diagram of another embodiment of a memory device of the present invention.

Referring to FIG. 3 there is shown a block level diagram of another embodiment of a memory device 150 of the present invention. The memory device 150 is similar to the memory device 50 shown in FIG. 2. Thus, an address line and a data line for the memory device 150 are connected to the first volatile memory 56. A controller 54 is directly connected to the NAND memory 52. The NAND controller 54 is further directly connected to the second volatile memory 58. Finally, the first volatile memory 56 is directly connected to the second volatile memory 58 to received data read from the NAND memory 52, and is also directly connected to the NAND controller 54 to write data to the NAND memory 52.

In the operation of the memory device 150, the device 150 functions in the same manner as the memory device 50. The only difference is that in the memory device 150, the data from the second volatile memory 58 is not required to pass through the NAND controller 54 resulting in faster data transfer to the first volatile memory 56. The memory device 150 also does not require any buffering in its NAND controller 54 for such transfer.

As can be seen from the foregoing, by using a second volatile memory as addition read cache memory, read disturbance to the non-volatile memory susceptible to read disturbance can be minimized.

What is claimed is:

1. A memory device comprising:
   a non-volatile electrically alterable memory which is selected from floating gate based non-volatile memory, SONOS based non-volatile memory, MONOS based non-volatile memory, or phase change based non-volatile memory and is susceptible to read disturbance;
   a control circuit for controlling the operation of the non-volatile memory;
   a first volatile cache memory, said first volatile cache memory connected to the control circuit and for storing data to be written to or read from said non-volatile memory, as cache for the memory device;
   a second volatile cache memory, said second volatile cache memory connected to the control circuit and for storing only data read from said non-volatile memory as read cache for the memory device;
   wherein the control circuit reads data from the second volatile cache memory in the event of a data miss from the first volatile cache memory, and reads data from the non-volatile memory in the event of a data miss from the first and second volatile cache memory.

2. The memory device of claim 1 wherein said control circuit stores data read from the non-volatile memory in said second volatile cache memory.

3. The memory device of claim 1 wherein said non-volatile memory is a floating gate based NAND non-volatile memory.

4. The memory device of claim 1 wherein said first volatile cache and said second volatile cache are formed in a single integrated circuit volatile memory.

5. The memory device of claim 1 wherein said control circuit stores data in said second volatile memory, data which is frequently missed from the first volatile memory.

6. The memory device of claim 1 wherein said control circuit is directly connected to said non-volatile memory and to said first and second volatile memories, and wherein the output of the second volatile memory is provided to said control circuit.

7. The memory device of claim 1 wherein said control circuit is directly connected to said non-volatile memory and to said first and second volatile memories, and wherein the output of the second volatile memory is provided to said first volatile memory.

8. The memory device of claim 1 wherein said first and second volatile memories are integrated with the control circuit.

9. A method of reading data from a memory device having a non-volatile electrically alterable memory susceptible to read disturbance, and a first volatile memory for storing cache for said device, a second volatile memory for storing read cache for said device, and a controller for operating said non-volatile memory and said first and second volatile memories, said method comprising:
   receiving a read request by said controller, said read request being an address to said non-volatile memory;
   determining if the data requested at the address to said non-volatile memory is in said first volatile memory;
   providing said data from said first volatile memory in the event the data requested at the address to said non-volatile memory is in said first volatile memory;
   determining if the data requested at the address to said non-volatile memory is in said second volatile memory, in the event the data requested at the address to said non-volatile memory is not in said first volatile memory;
   providing said data from said second volatile memory in the event the data requested at the address to said non-volatile memory is not in said first volatile memory and is in said second volatile memory; and
   reading data from the address to said non-volatile memory in the event the data requested at the address to said non-volatile memory is not in said first or second volatile memories.

10. The method of claim 9, further comprising the step of:
    storing the data read from the address to said non-volatile memory in said first volatile memory.

11. The method of claim 10, further comprising the step of:
    storing the data read from the address to said non-volatile memory in said second volatile memory.

12. The method of claim 11 wherein frequently requested data to be read from one or more addresses in the non-volatile memory, not stored in the first volatile memory, are stored in the second volatile memory.

13. The method of claim 9 further comprising:
    reading data from the address to said non-volatile memory and storing said read data in a location in said second volatile memory replacing data that was least recently accessed.

14. The method of claim 9 further comprising:
    reading data from the address to said non-volatile memory and storing said read data in a location in said second volatile memory replacing data that was least frequently accessed.

* * * * *